United States Patent [19]
Fong et al.

[11] Patent Number: 5,882,414
[45] Date of Patent: Mar. 16, 1999

[54] METHOD AND APPARATUS FOR SELF-CLEANING A BLOCKER PLATE

[75] Inventors: Gary L. Fong, Sunnyvale; Quoc Truong, San Jose; Visweswaren Sivaramakrishman, Santa Clara, all of Calif.

[73] Assignee: Applied Materials, Inc., Santa Clara, Calif.

[21] Appl. No.: 709,903

[22] Filed: Sep. 9, 1996

[51] Int. Cl.⁶ ..................................... C23C 16/00
[52] U.S. Cl. .................. 118/723 R; 118/723 E; 156/345; 134/1.1; 134/104.1; 438/729
[58] Field of Search .................. 134/104.1, 1, 1.1; 156/345 P; 204/298.07, 298.33; 118/723 R, 723 E, 715; 438/905, 729

[56] References Cited

U.S. PATENT DOCUMENTS 4,960,488  10/1990  Law et al. ............................... 156/643
5,647,911  7/1997  Vanell et al. ............................ 118/715
5,647,913  7/1997  Blalock .................................. 118/723 I Primary Examiner—R. Bruce Breneman
Assistant Examiner—Luz Alejandro
Attorney, Agent, or Firm—Patterson & Associates

[57] ABSTRACT

The present invention provides a method and apparatus for introducing gases into a processing chamber and cleaning isolated surfaces thereof. In one embodiment, the apparatus provides a gas distribution system which comprises a face plate and a blocker plate located adjacent the face plate wherein the blocker plate is electrically insulated from the face plate. An RF power source is electrically connected to the face plate and a switch that selectively connects the blocker plate to the RF power source or grounds the blocker plate. When the power source is applied to the faceplate and the blocker plate is grounded, an energy potential is formed between the face plate and the blocker plate. The energy potential is sufficient to strike a plasma from cleaning gases introduced into the gas distribution system to clean the apertures and surfaces of both the face plate and the blocker plate.

26 Claims, 5 Drawing Sheets

METHOD AND APPARATUS FOR SELF-CLEANING A BLOCKER PLATE

BACKGROUND OF THE INVENTION

1. Field of the Invention

The present invention relates to an apparatus for introducing gases into a processing chamber and a method of cleaning the components of the apparatus. More particularly, the present invention relates to a gas distribution plate for introducing gases into a processing chamber and a method for electrically isolating components of the gas distribution plate to form a plasma within the gas distribution plate to thereby effectively perform an in situ clean of the surfaces within the gas distribution plate by plasma enhanced chemical reactions.

2. Background of the Related Art

Chemical vapor deposition (CVD) is a process often used in the fabrication of integrated circuits to form thin films on the surface of substrates or to etch films therefrom. CVD processes, such as those used in the fabrication of integrated circuits, are carried out in process chambers which typically include a gas distribution assembly through which gases are introduced into the process chamber. Gas distribution assemblies are commonly utilized in CVD chambers to uniformly distribute gases over the substrate surface upon their introduction into the chamber. Uniform gas distribution is necessary to enhance uniform deposition characteristics on the surface of a substrate positioned in the chamber for processing.

Generally, a gas distribution assembly includes a grounded gas inlet manifold connected to a gas source to provide gases to a process chamber. The gas inlet manifold inlets gases into a gas gas diffuser to uniformly introduce gases into the CVD chamber above a substrate surface. Referring to FIG. 1, a gas diffuser system 10 communicates directly with the CVD chamber and typically includes a gas injection cover plate 14, a blocker plate 40, and a face plate 33 to evenly disperse gases inlet from a single gas feed line over at least the area of the substrate while minimizing turbulent gas flow. The blocker plate 40 is generally a flat, annular plate member having a plurality of very small apertures or holes passing therethrough to disperse the gas inlet therein uniformly into a space above the face plate 33. The gas is typically inlet from a single gas line wherein the reactant and carrier gases have been mixed, thereby providing a high concentration of gas over the center of the blocker plate 40 at a localized area. The face plate 33 is also a generally flat, annular member having a plurality of apertures or holes, larger than the apertures of the blocker plate 40, through which the gases pass or diffuse to provide a uniform concentration of gases evenly over the substrate.

As further shown in FIG. 1, the face plate 33 is typically disposed below the blocker plate 40 and at least partially forms the upper boundary of the processing region 76 of the chamber. Accordingly, the gases flow through the small apertures of the blocker plate 40 and subsequently through the apertures of the face plate 33 and into the chamber where they undergo plasma assisted chemical reactors. A substrate is typically positioned within the chamber on a substrate support member 72. The gas diffuser 10 is electrically biased by an RF power source 15 to generate a plasma in processing region 76. Precursor gases are inlet through the cover plate 14 and flow into the region 41 above the blocker plate 40. The gases are then dispersed above the blocker plate 40 and pass through the apertures formed in the blocker plate and into a space 78 above the face plate 33. The gases are then further dispersed over the upper surface of the face plate 33 and pass through the apertures formed in the face plate to uniformly distribute the gases over the surface of the substrate where the gases react with one another and deposit on the substrate.

Problems have arisen in utilizing the currently available gas distribution plates and other gas inlet means when the gases undergo unwanted chemical reactions in the gas distribution plate or gas inlet means and deposit therein, typically blocking the small passages of the inlet means, such as the small apertures formed in the blocker plate 40 or even the larger apertures of a face plate 33. The apertures formed in the blocker plate 40 are typically smaller than the apertures formed through the face plate 33 and are much more easily clogged by deposition of reactant gases which are introduced through the gas injection cover plate 14. As a result, the apertures formed through the blocker plate 40 may become clogged following about 1000 to 2000 deposition cycles. These deposits are particularly troubling since the gas diffuser system 10 facilitates uniform deposition of film layers on the substrates by evenly distributing the gases over the surface of the substrate. The rate of buildup of material within the gas diffuser system 10 can be substantially greater than in other areas of the chamber due to the high concentration of precursor and reactant gases and the close proximity of the plasma. After further repetitive CVD processes, the deposits will eventually clog the apertures in the gas diffuser system 10 and require a system shutdown so that the gas diffuser system can be replaced. A system shutdown is very costly due to the downtime and, in addition, a gas diffuser system which cannot be cleaned must be replaced which increases the manufacturing cost.

It would be desirable to clean the gas distribution assembly including the gas diffuser system 10 without the need to remove the gas diffuser system from the chamber, such as when a routine plasma cleaning operation is performed in the chamber. In situ cleaning of the internal chamber walls is typically accomplished by introducing reactive cleaning gases into the chamber, grounding the chamber walls, applying an RF voltage to the gas diffuser system 10 to generate a plasma between the gas diffuser system 10 and the substrate support member 72, and using the plasma to enhance the reaction between the cleaning gases and the material deposited on the surfaces within the chamber . Reaction products are formed which can easily be exhausted from the chamber. During this cleaning process, the face plate 33 may be at least partially cleaned because the plasma is generated adjacent to the face plate allowing the chemical reaction between the cleaning gases and the deposition material formed on the face plate to occur. However, the blocker plate 40, as well as other components of the gas diffuser system 10, are isolated from the plasma region. Therefore, the typical in situ chamber cleaning process is not effective at cleaning material which is deposited within the gas diffuser system 10, especially the small apertures in the blocker plate 40.

Presently, there does not exist an effective self-cleaning blocker plate or a method of cleaning a blocker plate in situ. As a result, the entire gas diffuser system must be removed and replaced. Therefore, there is a need for an apparatus for introducing gases into a processing chamber and a method for in situ cleaning of gas inlet components which are typically isolated from the plasma region within a chamber and are susceptible to build up of deposition material thereon. It would be desirable if the apparatus were simple and economical to reduce manufacturing costs.

SUMMARY OF THE INVENTION

The present invention provides a method and apparatus for selectively providing an electrical potential to an isolated surface within a processing chamber to selectively enable plasma cleaning of the surface and to also enable plasma processing.

In one aspect of the invention, a method for selectively providing an electrical potential to a surface within a gas distribution system utilized in a processing chamber is provided comprising the steps of: a) electrically isolating the surface to be selectively biased from the other system components, and b) selectively providing an electrical signal to the surface or grounding the surface. More particularly, this aspect of the invention enables a surface within a gas distribution system to be selectively grounded while a second surface adjacent the first surface is electrically biased so that a plasma may be formed in the gas distribution system adjacent the first surface to effect plasma assisted cleaning of the first surface. This aspect of the invention thereby provides in situ cleaning of isolated chamber components within a processing chamber.

In another aspect of the invention, an apparatus for introducing gases into a processing chamber is provided having a base plate defining a void therethrough, a face plate disposed through the void formed in the base plate and extending therebelow, a blocker plate disposed adjacent the face plate, the blocker plate being electrically insulated from the face plate and the base plate, and a power source connected to both the face plate and the blocker plate, wherein the power source may be selectively applied to both the blocker plate and the face plate or to the face plate while the blocker plate is grounded.

In still another aspect of the present invention, a gas distribution system is provided having a base plate, a face plate, and a blocker plate disposed between the base plate and the face plate. The blocker plate is provided with an electrical feedthrough through which an electrical potential may be provided to the blocker plate. An RF signal and a ground potential may be alternately applied to the blocker plate to generate a plasma adjacent the surface to be cleaned. The present invention thereby provides a method and apparatus for selectively enabling a surface disposed in a gas distribution assembly, and isolated from a processing plasma, to be cleaned using a cleaning plasma.

BRIEF DESCRIPTION OF THE DRAWINGS

So that the manner in which the above recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The present invention provides a method and apparatus for cleaning surfaces or passages within a processing chamber which are not normally exposed to a plasma during in situ cleaning processes, by electrically isolating or grounding the surface or passage and striking a plasma adjacent thereto. In one aspect of the invention, as shown in FIGS. 2 through 6 a method and apparatus is provided for cleaning a blocker plate 42 or other gas diffuser disposed within a gas distribution system 20 by electrically isolating the blocker plate 42 or gas diffuser and selectively grounding the blocker plate or gas diffuser while biasing the other parts of the gas distribution system to strike a plasma adjacent to the blocker plate or gas diffuser. In another aspect of the invention, a gas inlet passage within a gas inlet nozzle may be electrically isolated to enable an in situ plasma assisted chemical clean process to be performed therein. The method and apparatus are particularly useful for in situ plasma cleaning of the isolated member or passage, thereby reducing the amount of time required to clean the chamber and reducing the cost of ownership and cost of consumables.

While a preferred embodiment is described herein with reference to isolation of a blocker plate 42 in a gas distribution system 20 within a chemical vapor deposition chamber, it is to be understood that the present invention is equally applicable to clean material deposits formed on other isolated surfaces in any type of processing chamber (e.g., a physical vapor deposition chamber, an etch chamber, a high density plasma CVD chamber, etc.).

Figure 1:
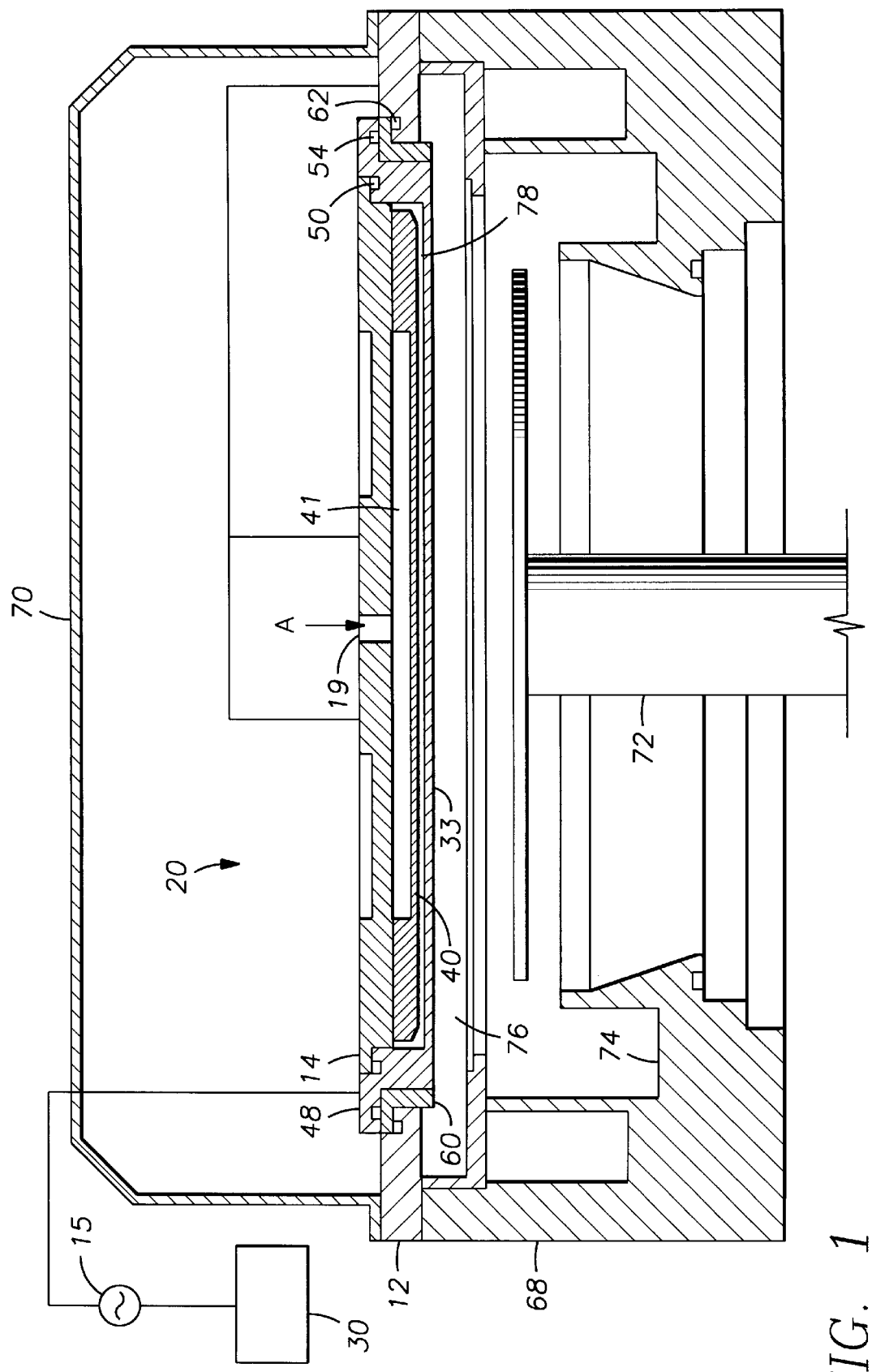
FIG. 1 (Prior Art) is a cross-sectional view of a conventional gas distribution assembly in a CVD chamber, including a gas diffuser system.
Figure 2:
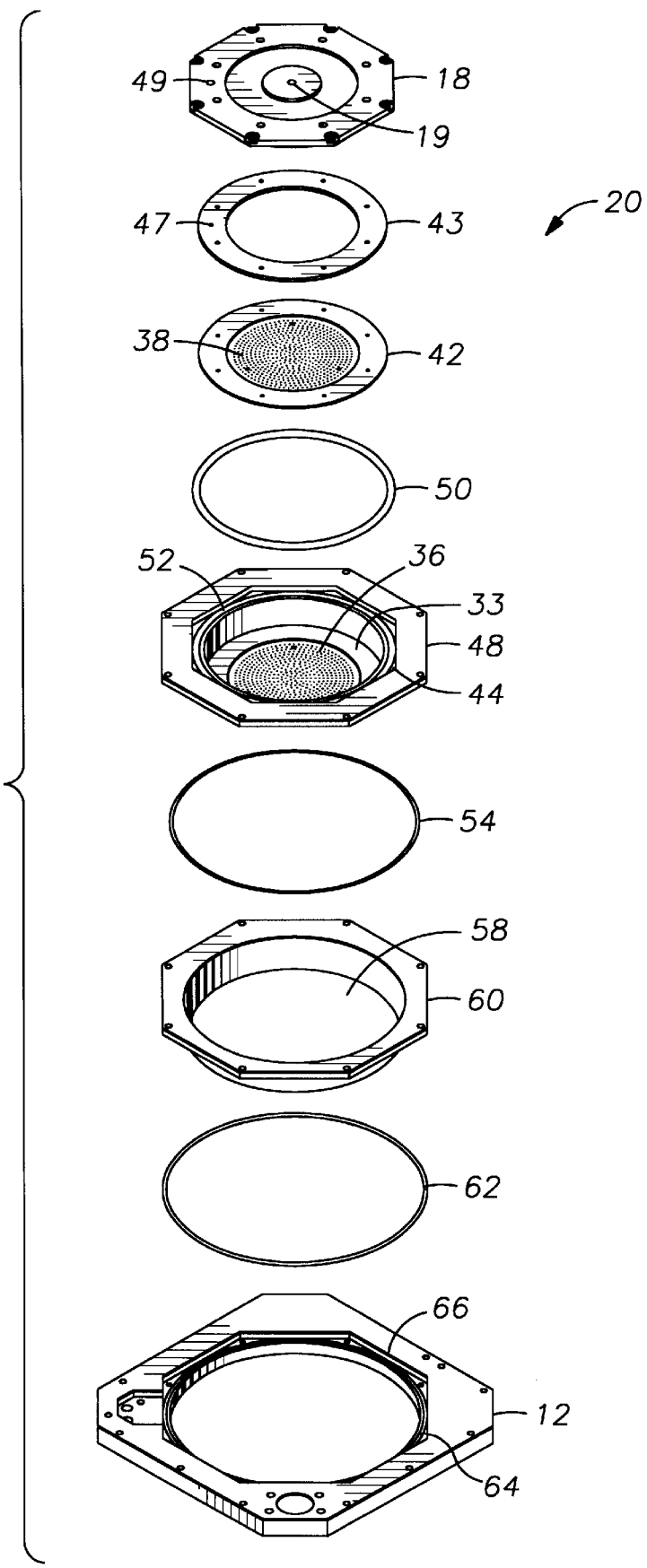
FIG. 2 an exploded view of a gas distribution system forming a portion of the gas distribution assembly of the present invention.
Figure 3:
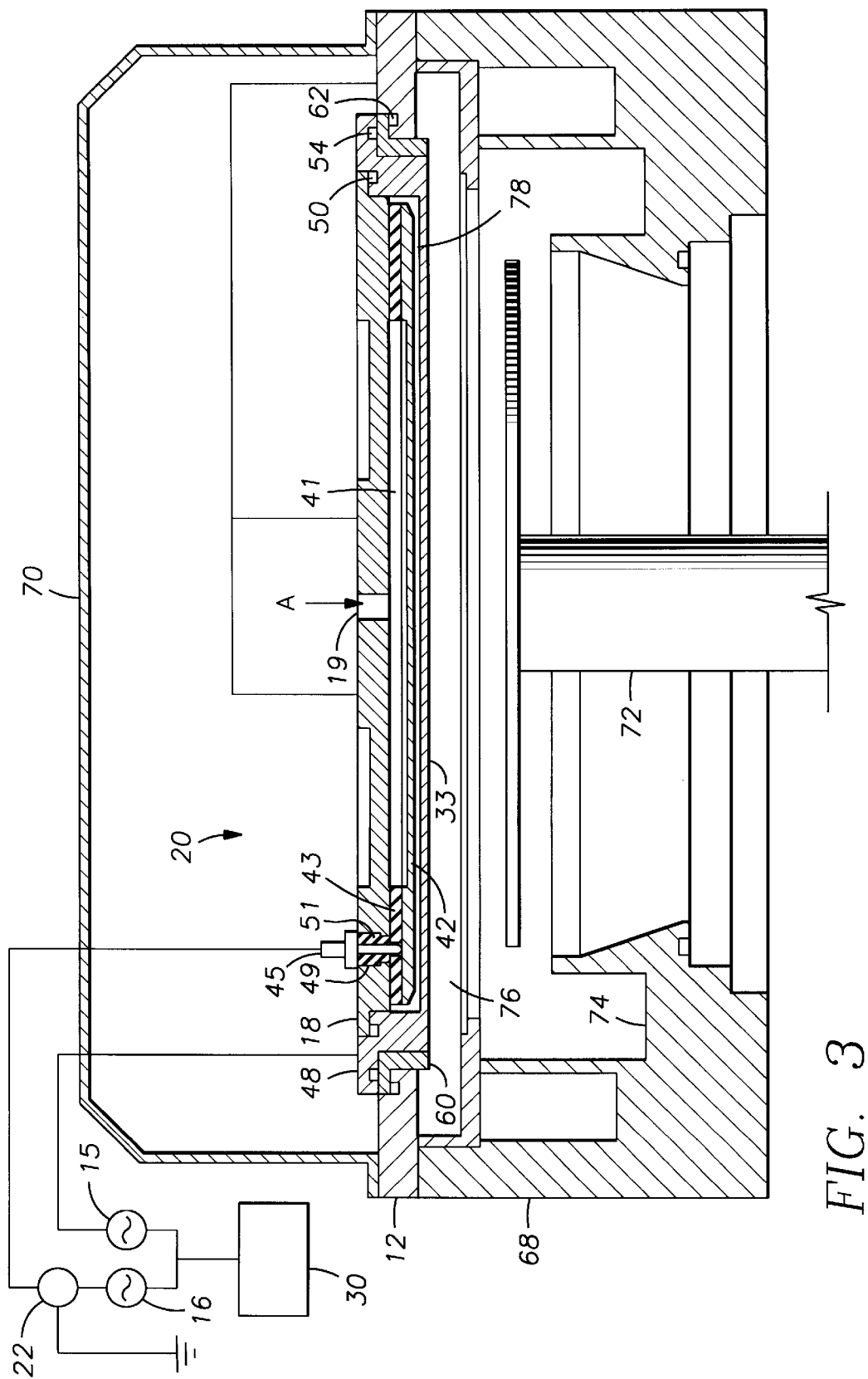
FIG. 3 is a cross-sectional view of a chemical vapor deposition chamber including a gas distribution system of the present invention.
Figure 4:
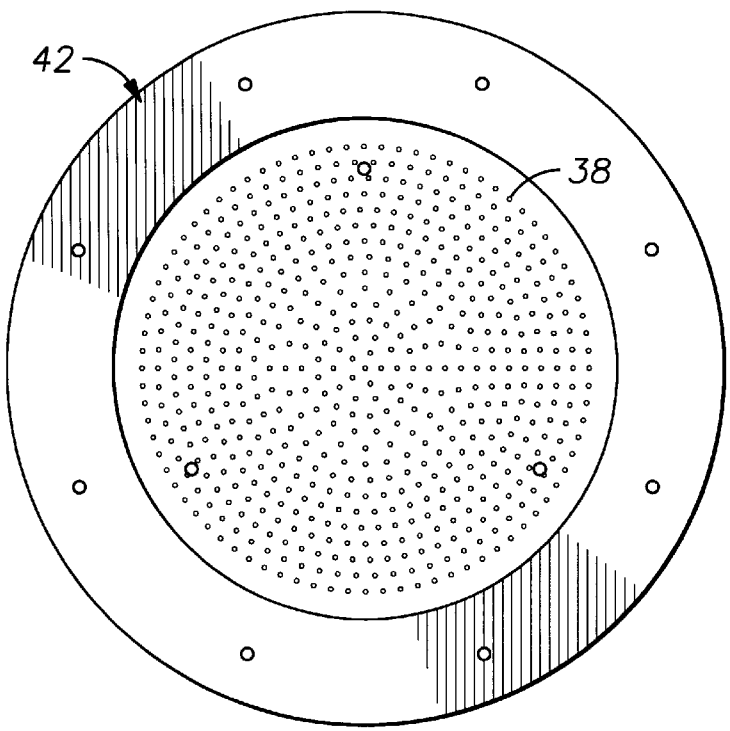
FIG. 4 is a top view of a blocker plate showing a plurality of small gas passages or apertures formed therein.

FIG. 2 depicts an exploded view of one embodiment of a gas distribution system 20 which mounts in a base plate 12 of a CVD chamber. As shown in FIG. 3, the gas distribution system 20 essentially replaces the conventional gas diffuser system 10 shown in FIG. 1 and has many of the same components. As shown in FIGS. 2 and 3, the gas distribution system 20 includes a gas injection cover plate 18 defining a central gas inlet passage 19 through which gases are provided into the system 20. A gas diffuser or blocker plate 42 having apertures 38 is mounted below the cover plate 18 and defines a cavity 41 therebetween. An RF isolation ring 43 is located between the gas injection cover plate 18 and the blocker plate 42 to electrically isolate the blocker plate 42 from the cover plate 18. The RF isolation ring 43 is comprised of a non-conductor, such as a ceramic or polymer material to isolate the blocker plate 42 from the cover plate 18. An RF feedthrough 45 (shown in FIG. 3) is disposed through channels 47 and 49 formed through the RF isolation ring 43 and the gas injection cover plate 18 to selectively provide RF power to or ground the blocker plate 42. The gas injection cover plate 18 and gas blocker plate 42 are mounted within an octagonally shaped mounting orifice 44 that is centrally formed in a raised, annular outer surface 48 of a face plate 33 having apertures 36, the face plate 33 utilizing an o-ring seal 50 which mounts within an o-ring groove 52. A second o-ring seal 54 resides within an o-ring groove formed in the underside of the outer surface 48 of the faceplate 33, and the faceplate 33 is mounted within a central orifice 58 formed through an RF isolation plate 60. The RF isolation plate 60 is also comprised of a non-conductor, such as a ceramic or polymer material, to isolate the RF power from the grounded base plate 12. Thereafter, utilizing another o-ring 62 which resides within an o-ring groove 64 formed in the base plate 12, the assembled components are mounted into an octagonal recess 66 formed within the base plate 12.

FIG. 3 depicts a cross-sectional view of a CVD chamber having a gas distribution system 20 of the present invention positioned therein. The CVD processing chamber includes chamber walls 68 which support the gas distribution system 20 on the upper edge of the walls 68. Substrate support member 72 is disposed in the lower portion of the chamber and extends through the lower wall of the chamber to support a substrate thereon during processing. A vacuum exhaust channel 74 is disposed about the outer perimeter of the substrate support member to uniformly exhaust gases from the chamber. A cover 70 is typically disposed over the gas distribution assembly to shield the gas distribution system 20.

Figure 5:
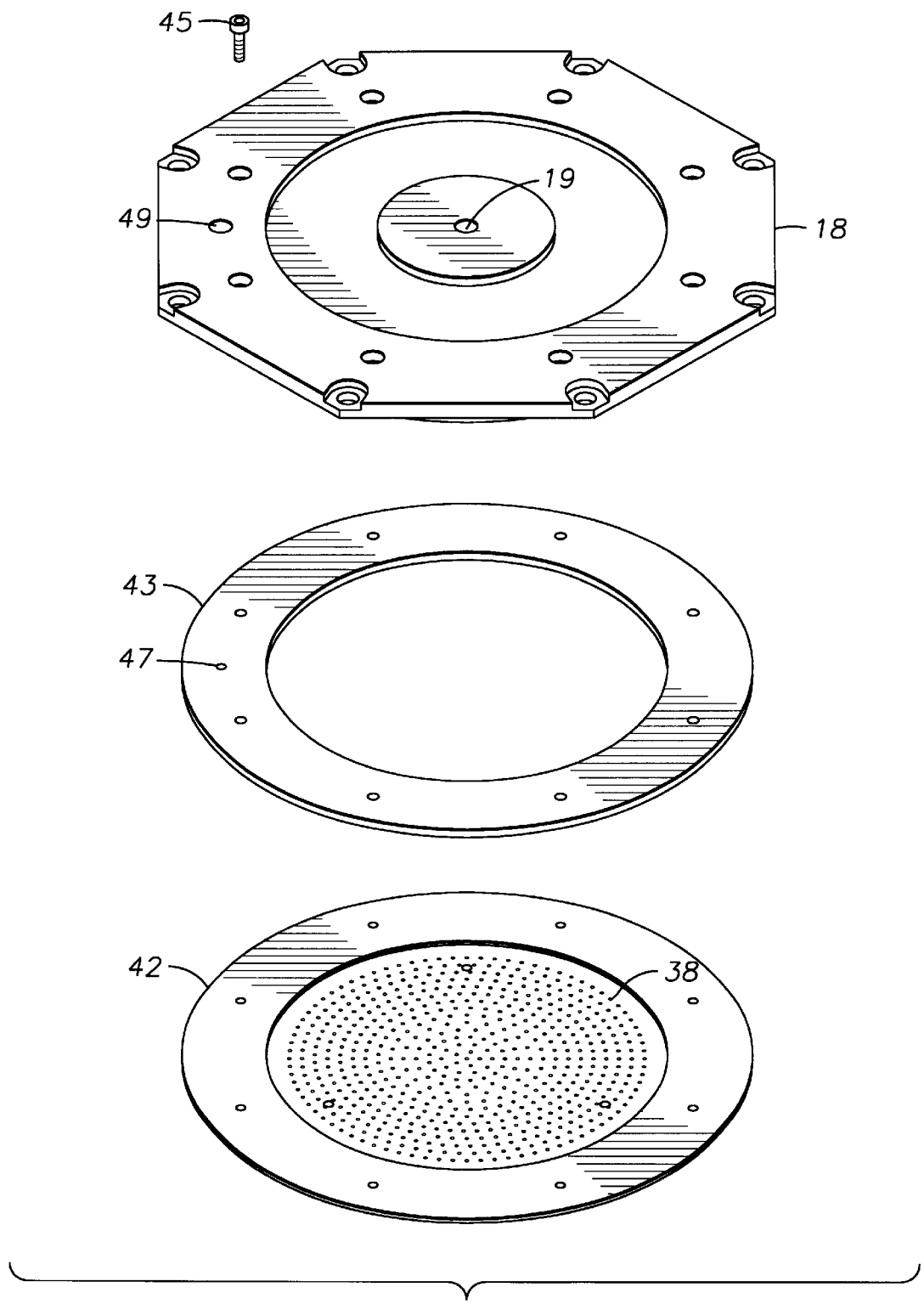
FIG. 5 is an exploded view of the blocker plate and insulating members used to electrically isolate the blocker plate from a cover plate.

As shown in FIGS. 3 and 5, the present invention is implemented by electrically isolating the blocker plate 42 from the gas injection cover plate 18 by providing the RF isolation ring 43 disposed between the blocker plate 42 and the gas injection cover plate 18. The blocker plate 42, RF isolation ring 43, and the gas injection cover plate 18 are connected by insulating screws, such as TEFLON or ceramic screws, to ensure electrical isolation therebetween. A channel 49 is formed through the cover plate 18 and a channel 47 through the insulative ring 43 through which an RF feedthrough 45 extends to provide RF power to the blocker plate 42 during the deposition process. An insulating sleeve 51 is disposed in channel 49 to house the electric feedthrough 45 and is preferably made of an insulative material such as a ceramic or TEFLON. Any type of commercially available feedthrough may be used to advantage in the present invention.

Figure 6:
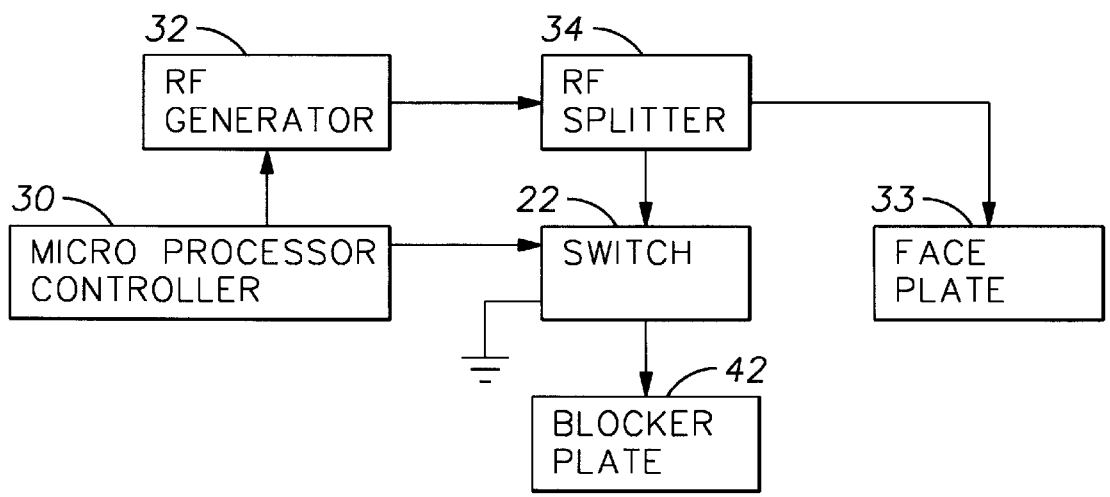
FIG. 6 is a schematic diagram of the controller and power supply of one embodiment of the present invention.

As shown in FIGS. 3 and 6, an RF power source 16 is applied to the feedthrough 45 while an RF power source 15 is supplied to the outer surface 48 of the faceplate 33. The RF power sources 15, 16 are most conveniently provided by a single RF generator 32 connected to an RF splitter 34 to provide a matching signal so that during processing the entire gas distribution system 20 can be RF biased. An electrical relay switch 22 is located between the RF power source 16 for the blocker plate 42 and the feedthrough 45 to enable the blocker plate 42 to be biased RF hot or grounded to selectively enable deposition etch or cleaning processes to be selectively performed within the chamber.

In the prior art as shown in FIG. 1, the blocker plate 40, the gas injection cover plate 14, and the faceplate 33 are in electrical communication with each other and are electrically isolated from the base plate 12 by RF isolation plate 60. The present invention departs from the prior art device through the inclusion of the electrically isolated blocker plate 42, an electrical feedthrough 45, and a switch 22 through which the blocker plate 42 can be selectively connected to an RF power source 16 or grounded. The inventors have discovered that by electrically isolating the blocker plate 42 from the gas injection cover plate 18 and the faceplate 33 and by providing a switch 22 to ground or independently power the blocker plate 42, a plasma can be selectively formed in the regions 41 and 78, concurrently or independently of the formation of a plasma in region 76, thereby enabling the apertures 38 and the surfaces of the blocker plate 42 to be cleaned by plasma enhanced reactive chemistry.

Operation of the CVD chamber is typically controlled by a microprocessor 30 which is programmed to operate various valves and switches as well as the RF power sources. When a single RF generator 32 is used with a splitter 34 as previously described to form the two RF power sources 15 and 16 shown in FIG. 3, the relay switch 22 is the only additional component which must be controlled by the microprocessor 30 in comparison to the prior art. The relay switch can include solid state relays or other electrical switching means. The microprocessor 30 could interface with the relay switch 22 by use of transistors or numerous other microelectronic devices currently available.

To initiate the cleaning process of the blocker plate 42, the switch 22 is positioned to ground the blocker plate 42. An RF signal is applied from RF source 15 to the gas injection cover plate 18 and faceplate 33 to provide an energy potential between the faceplate 33 and the grounded blocker plate 42 and between the cover plate 18 and the grounded blocker plate 42. The energy potential on both sides of the blocker plate 42 forms a plasma of cleaning gases on both sides of the blocker plate 42 in regions 41 and 78. The plasma is in intimate contact with any deposits on both surfaces of the blocker plate 42 as well as the apertures 38 in the blocker plate to provide more efficient cleaning than can be achieved using a plasma in region 76 alone.

The power supplied to the gas distribution system 20 during the cleaning of the blocker plate 42, preferably about 500–1500 W, is preferably less than the power supplied during conventional cleaning because the plasma regions 41 and 78 are much smaller than plasma region 76. It should be understood that the power and frequency of the RF signal depend on the cleaning gases used and the distance between the RF hot electrodes and the grounded blocker plate 42.

Cleaning gases are provided through the gas injection cover plate 18 along arrow A as shown in FIG. 3, to react in the plasma region 78 with the material which is built up on the internal surfaces of the gas distribution system 20, and particularly the blocker plate 42 to form relatively stable by-products which can be exhausted from the chamber. It should be recognized that the injection of cleaning gases and the exhaust of by-product gases may be accomplished through batch flow or, more preferably, continuous flow. The preferred cleaning gas is nitrogen fluoride, $NF_3$, however, other cleaning gases, such as $CF_4$, $C_2F_6$, may be used alone or in combination.

Conventional cleaning of the chamber is initiated by positioning the switch 22 to connect the blocker plate 42 to RF power source 16 so that the entire gas distribution system 20 is RF hot and a plasma can be generated in plasma region 76.

The switch 22 also connects the blocker plate 42 to the RF source 16 during substrate processing wherein a process gas is fed to the chamber and a plasma is established between the gas distribution system 20 and the substrate to form a thin film on the substrate or to etch a film previously formed on the substrate. A number of substrates may be processed accordingly until cleaning of deposits in the gas distribution system is needed.

While the foregoing is directed to the preferred embodiment of the present invention, other and further embodiments of the invention may be devised without departing from the basic scope thereof. The scope of the invention is determined by the claims which follow.

What is claimed is:

1. An apparatus for providing gases into a processing chamber and selectively forming a plasma adjacent a gas diffusing member, comprising:

(a) a gas inlet housing having a gas diffusing member disposed therein between a gas inlet port and a gas outlet port, wherein the gas diffusing member is electrically isolated from the inlet port and the outlet port;

(b) a power generator selectively coupled to the gas diffusing member and the gas inlet housing; and (c) a switch located between the power generator and the gas diffusing member to selectively ground the gas diffusing member and generate a plasma between the diffusing member and the gas inlet housing.

2. The apparatus of claim 1, further comprising a microprocessor coupled to the switch wherein the microprocessor is programmed to activate the switch to ground the diffusing member during a cleaning process and to couple the diffusing member to the power generator during processing of a substrate.

3. The apparatus of claim 2, wherein the gas diffusing member is a blocker plate.

4. The apparatus of claim 3, wherein the power generator and electrical ground are selectively coupled to the blocker plate through an electrical feedthrough.

5. An apparatus for introducing processing and cleaning gases into a processing chamber, comprising:

(a) a base plate defining a void therethrough;

(b) a face plate disposed through the void formed in the base plate and extending therebelow, said face plate being generally parallel with the base plate;

(c) a blocker plate disposed adjacent the face plate, the blocker plate being electrically insulated from the face plate and the base plate; and (d) a power generator connected to the face plate and selectively connected to the blocker plate, wherein the blocker plate is connected to the power generator or is grounded.

6. The apparatus of claim 5, wherein the power generator is coupled through an electrical feedthrough to the blocker plate.

7. The apparatus of claim 6, wherein an insulator is disposed between the blocker plate and the base plate.

8. The apparatus of claim 5, further comprising an electrical switch to selectively connect the power generator to the blocker plate.

9. The apparatus of claim 8, further comprising a processor to control the electrical configuration of the chamber components.

10. A method of cleaning a gas inlet member, comprising the steps of:

(a) electrically isolating a surface to be cleaned within the gas inlet member;

(b) grounding the electrically isolated surface;

(c) biasing a second surface within the gas inlet member opposite the electrically isolated surface; and (d) introducing a cleaning gas into a space provided between the surface to be cleaned and the biased surface to generate a cleaning plasma therebetween.

11. The method of claim 10, wherein the surface to be cleaned is a blocker plate and the biased surface is a face plate.

12. The method of claim 11, wherein the step of electrically isolating a surface to be cleaned comprises providing an insulating member between the blocker plate and a base plate to which the blocker plate is supported in the gas inlet member.

13. The method of claim 11, wherein the blocker plate may be switched between a ground potential and a bias potential.

14. The method of claim 13, further comprising the step of coupling the blocker plate and the face plate to the same RF voltage source through an RF splitter.

15. The method of claim 14, further comprising the step of disposing an insulating member between the blocker plate and the base plate.

16. The method of claim 15, further comprising the step of selectively biasing the blocker plate to generate a plasma between the face plate and the blocker plate.

17. A method for selectively providing an electrical potential to a surface within a gas distribution system in a processing chamber, comprising the steps of:

(a) electrically isolating the surface to be selectively biased from the other gas distribution system components;

(b) providing an electrical power feedthrough to the surface;

(c) providing a power source through the feedthrough to the surface during processing; and (d) providing a ground potential through the feedthrough to the surface during a cleaning process for the gas distribution system.

18. The method of claim 17, wherein the surface is a blocker plate having at least one aperture formed therethrough.

19. The method of claim 17, wherein the power source comprises an RF generator.

20. The method of claim 19, wherein the electrical potential provided to the surface is switched between an RF signal and ground.

21. The method of claim 18, wherein the blocker plate is connected to the power source during processing.

22. The method of claim 18, wherein the blocker plate is grounded during a cleaning process to generate a cleaning plasma adjacent the surface.

23. A processing chamber having a self-cleaning gas distribution system, comprising:

a gas injection cover plate having a gas inlet port;

a faceplate conductively mounted on the cover plate, the faceplate having a plurality of holes and a raised annular outer surface that receives the cover plate;

a blocker plate non-conductively mounted on the cover plate within an enclosed region defined by the cover plate and the faceplate, the blocker plate having a plurality of holes;

a first RF power source connected to the faceplate;

a second RF power source selectively connected to the blocker plate; and a relay switch which delivers power from the second RF power source to the blocker plate or grounds the blocker plate.

24. The processing chamber of claim 23, wherein the first and second RF power sources comprise an RF generator connected to an RF splitter.

25. The processing chamber of claim 24, further comprising an RF isolation ring which separates the blocker plate and the cover plate.

26. The processing chamber of claim 24, wherein the switch is connected to the blocker plate with an electrical feedthrough that passes through the cover plate .

* * * * *